United States Patent
Lee et al.

(10) Patent No.: US 11,329,219 B2
(45) Date of Patent: May 10, 2022

(54) METHOD OF MANUFACTURING A MAGNETORESISTIVE RANDOM ACCESS MEMORY DEVICE

(71) Applicant: Samsung Electronics Co., Ltd., Suwon-si (KR)

(72) Inventors: Jungmin Lee, Gwangmyeong-si (KR); Younghyun Kim, Seoul (KR); Junghwan Park, Seoul (KR); Sechung Oh, Yongin-si (KR); Kyungil Hong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 47 days.

(21) Appl. No.: 16/840,741

(22) Filed: Apr. 6, 2020

(65) Prior Publication Data
US 2021/0043833 A1 Feb. 11, 2021

(30) Foreign Application Priority Data

Aug. 6, 2019 (KR) ........................ 10-2019-0095589

(51) Int. Cl.
*H01L 43/12* (2006.01)
*H01L 27/22* (2006.01)
*H01L 21/02* (2006.01)
*H01L 43/08* (2006.01)

(52) U.S. Cl.
CPC ........ *H01L 43/12* (2013.01); *H01L 21/02274* (2013.01); *H01L 27/222* (2013.01); *H01L 43/08* (2013.01)

(58) Field of Classification Search
CPC .. H01F 10/324; H01F 10/3281; H01F 41/303; H01F 41/32; H03M 2201/818
See application file for complete search history.

(56) References Cited

U.S. PATENT DOCUMENTS

| | | |
|---|---|---|
| 7,488,694 B2 | 2/2009 | Kim et al. |
| 7,651,961 B2 | 1/2010 | Clark |
| 7,935,542 B2 | 5/2011 | Murata et al. |
| 9,355,837 B2 | 5/2016 | Marsh |
| 9,515,252 B1 | 12/2016 | Annunziata et al. |
| 9,589,790 B2 | 3/2017 | Henri et al. |
| 9,691,972 B1 | 6/2017 | Annunziata et al. |

(Continued)

FOREIGN PATENT DOCUMENTS

KR 101202685 B1 11/2012

*Primary Examiner* — Telly D Green
*Assistant Examiner* — Andre C Stevenson
(74) *Attorney, Agent, or Firm* — Harness, Dickey & Pierce, P.L.C.

(57) ABSTRACT

In a method of manufacturing a magnetoresistive random access memory, a memory structure may be formed on a substrate. The memory structure may include a lower electrode, a magnetic tunnel junction (MTJ) structure, and an upper electrode sequentially stacked. A protection layer including silicon nitride may be formed to cover a surface of the memory structure. The protection layer may be formed by a chemical vapor deposition process using plasma and introducing deposition gases including a silicon source gas, a nitrogen source gas containing no hydrogen and a dissociation gas. Damages of the MTJ structure may be decreased during forming the protection layer. Thus, the MRAM may have improved characteristics.

18 Claims, 8 Drawing Sheets

(56) References Cited

U.S. PATENT DOCUMENTS

| | | |
|---|---|---|
| 10,157,736 B2 | 12/2018 | van Schravendijk et al. |
| 2007/0202254 A1* | 8/2007 | Ganguli ............ H01L 21/76846 |
| | | 427/252 |
| 2007/0207624 A1* | 9/2007 | Chua ................ H01L 21/28202 |
| | | 438/758 |
| 2014/0061636 A1* | 3/2014 | Miyake ............. G02F 1/136213 |
| | | 257/43 |
| 2017/0054070 A1* | 2/2017 | Bak ......................... H01L 43/10 |
| 2018/0190901 A1* | 7/2018 | Annunziata ............. H01L 43/12 |
| 2018/0277750 A1* | 9/2018 | Kim ...................... G11C 11/161 |

* cited by examiner

METHOD OF MANUFACTURING A MAGNETORESISTIVE RANDOM ACCESS MEMORY DEVICE

CROSS-REFERENCE TO RELATED APPLICATION

This application claims priority under 35 USC § 119 to Korean Patent Application No. 10-2019-0095589, filed on Aug. 6, 2019 in the Korean Intellectual Property Office (KIPO), the contents of which are herein incorporated by reference in their entirety.

BACKGROUND

1. Field

Example embodiments relate to a semiconductor device and method of manufacturing the same. More particularly, example embodiments relate to a magnetoresistive random access memory (MRAM) device and method of manufacturing the same.

2. Description of the Related Art

Each cell of the MRAM device includes a cell structure in which a lower electrode, a magnetic tunnel junction (MTJ) structure, and an upper electrode are sequentially stacked. Further, a protection layer for protecting the cell structure may be formed on a surface of the cell structure. The protection layer may directly contact the surface of the cell structure. Thus, plasma damages may be caused to the cell structure during the process for forming the protection layer.

SUMMARY

Example embodiments provide methods of manufacturing an MRAM device having improved characteristics.

According to some example embodiments, there is provided a method of manufacturing an MRAM device including forming a memory structure on a substrate, the memory structure including a lower electrode, a magnetic tunnel junction (MTJ) structure, and an upper electrode sequentially stacked on the substrate, and forming a protection layer covering a surface of the memory structure, the protection layer including silicon nitride, wherein the forming the protection layer includes a chemical vapor deposition process, the chemical vapor deposition process including using a plasma, and introducing deposition gases including a silicon source gas, a nitrogen source gas containing no hydrogen and a dissociation gas.

According to some example embodiments, there is provided a method of manufacturing an MRAM device comprising forming a transistor on a substrate, the transistor including a gate, a first impurity region and a second impurity region, forming a source line electrically connected to the first impurity region, forming a memory structure including a lower electrode, a magnetic tunnel junction (MTJ) structure and an upper electrode sequentially stacked, the memory structure being electrically connected to the second impurity region, forming a protection layer covering a surface of the memory structure, the protection layer including silicon nitride, and forming a bit line on the memory structure, the bit line being electrically connected to the upper electrode of the memory structure, wherein the forming the protection layer includes a chemical vapor deposition process including using a plasma, and introducing deposition gases including a silicon source gas, a nitrogen source gas containing no hydrogen and a dissociation gas.

According to some example embodiments, there is provided a method of manufacturing an MRAM device including, sequentially forming a lower electrode layer, a magnetic tunnel junction (MTJ) layer, and an upper electrode layer on a substrate, etching portions of the upper electrode layer, the MTJ layer, and the lower electrode layer to form a memory structure, the memory structure including a lower electrode, an MTJ structure, and an upper electrode on the substrate, loading the substrate into a deposition chamber, forming a protection layer covering a surface of the memory structure, the protection layer including silicon nitride, wherein the forming the protection layer includes introducing a silicon source gas, a nitrogen source gas containing no hydrogen, and a dissociation gas into the deposition chamber, and periodically applying an R.F. power in a pulse to generate plasma.

In manufacturing of the MRAM device in accordance with some example embodiments, the protection layer may be formed on a surface of the memory structure including the lower electrode, the MTJ structure and the upper electrode sequentially stacked. Also, the protection layer may be formed by a plasma enhanced-chemical vapor deposition (PE-CVD) process using a nitrogen source gas containing no hydrogen as a deposition gas. Thus, damages on the surface of the memory structure may decrease, and the memory structure may be effectively protected by the protection layer.

BRIEF DESCRIPTION OF THE DRAWINGS

Example embodiments will be more clearly understood from the following detailed description taken in conjunction with the accompanying drawings.

FIGS. 1 to 5 are cross-sectional views illustrating a method of manufacturing an MRAM device in accordance with some example embodiments;

FIG. 6 is a plan view illustrating an example of an apparatus including an etching chamber and a deposition chamber;

FIG. 7 is a timing diagram of plasma pulses in a deposition process; and

FIGS. 8 to 12 are cross-sectional views illustrating a method of manufacturing a magnetoresistive memory device.

DETAILED DESCRIPTION

Figure 6:
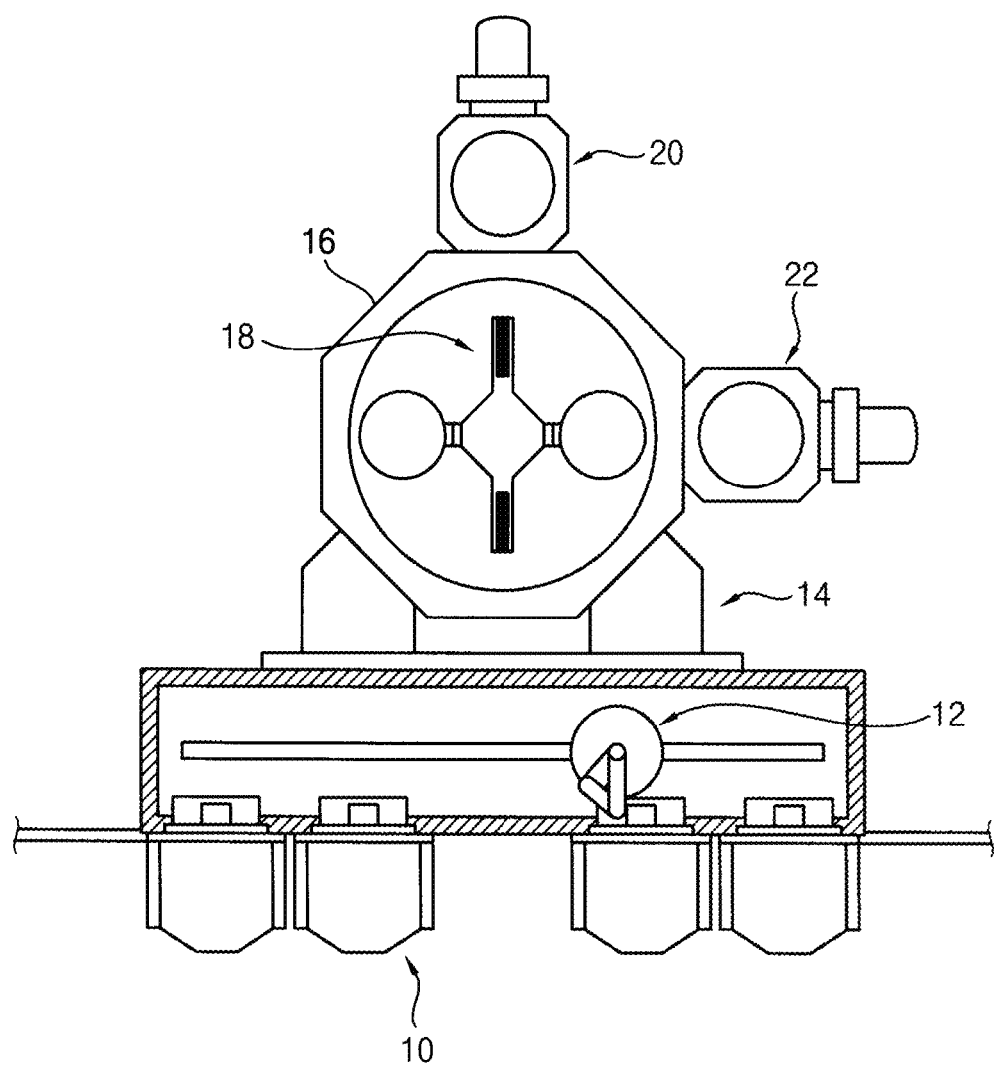
Figure 7:
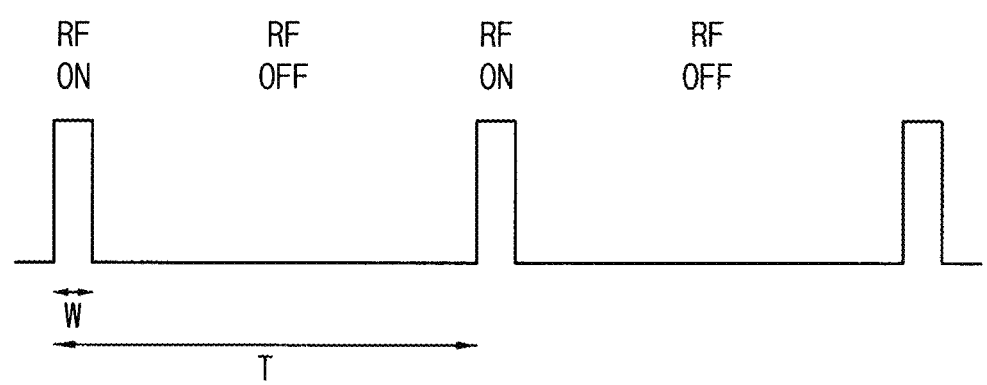

FIGS. 1 to 5 are cross-sectional views illustrating a method of manufacturing an MRAM device in accordance with some example embodiments. FIG. 6 is a plan view illustrating an example of an apparatus including an etching chamber and a deposition chamber. FIG. 7 is a timing diagram of plasma pulses in a deposition process.

Figure 1:
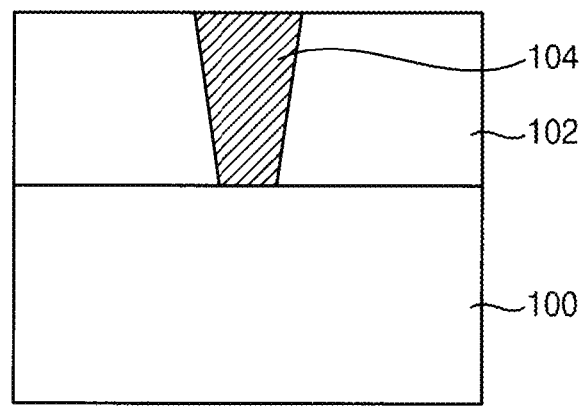
FIGS. 1 to 12 represent non-limiting, example embodiments as described herein.

Referring to FIG. 1, a first insulating interlayer 102 may be formed on a substrate 100. A contact plug 104 may be formed through the first insulating interlayer 102, and the contact plug 104 may contact an upper surface of the substrate 100.

The substrate 100 may include silicon, germanium, silicon-germanium, or group III-V compounds such as GaP, GaAs, GaSb, or the like. In some example embodiments, the substrate 100 may be a silicon-on-insulator (SOI) substrate or a germanium-on-insulator (GOI) substrate.

Although not shown, various elements, e.g., word lines, transistors, diodes, source/drain layers, source lines and/or wirings may be further formed on the substrate 100.

The first insulating interlayer 102 may include an oxide, e.g., silicon oxide. The first insulating interlayer 102 may be formed by a chemical vapor deposition process, an atomic layer deposition process or a spin coating process.

For forming the contact plug 104, first, a contact hole exposing the upper surface of the substrate 100 may be formed through first insulating interlayer 102. A conductive layer may be formed on the substrate 100 and the first insulating interlayer 102 to fill the contact hole. An upper portion of the conductive layer may be planarized until an upper surface of the first insulating interlayer 102 may be exposed to form the contact plug 104. The contact plug 104 may include a barrier layer pattern and/or a metal pattern. The barrier layer pattern may include, e.g., titanium, tantalum, tungsten nitride, titanium nitride, tantalum nitride, or the like. The metal pattern may include, e.g., tungsten, copper, aluminum, or the like. In some example embodiments, the contact plug 104 may include doped polysilicon. The contact plug 104 may serve as a lower electrode contact.

Figure 2:
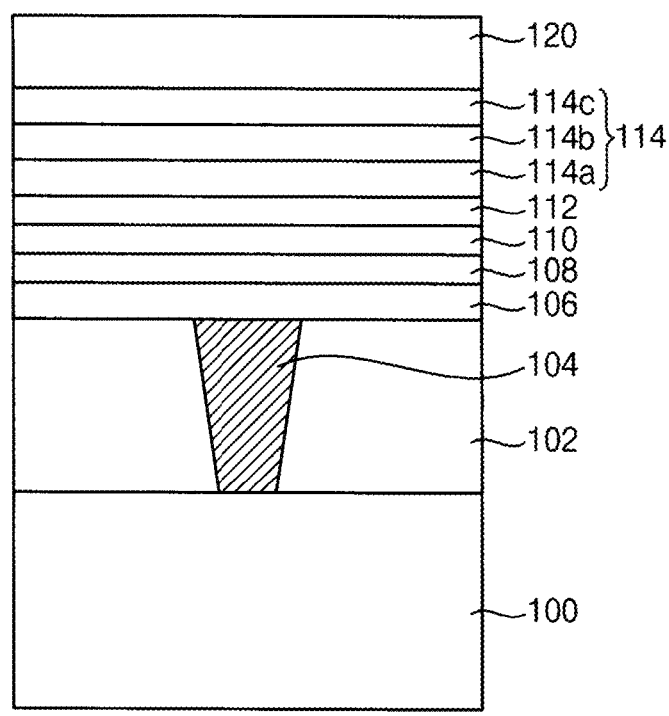

Referring to FIG. 2, a lower electrode layer 106, an MTJ layer 114 and an upper electrode layer 120 may be sequentially formed on the first insulating interlayer 102 and the contact plug 104.

In some example embodiments, a blocking layer 108, an adhesion layer 110 and/or a seed layer 112 may be further formed between the lower electrode layer 106 and the MTJ layer 114. Alternatively, the blocking layer 108, the adhesion layer 110 and/or the seed layer 112 may not be formed.

The lower electrode layer 106 may be formed to include metal and/or metal nitride. The lower electrode layer 106 may include at least one of a metal, e.g., tungsten, titanium, tantalum, or the like, and/or a metal nitride, e.g., tungsten nitride, titanium nitride, tantalum nitride, or the like. A barrier metal layer (not shown) may be further formed on the lower electrode layer 106.

The blocking layer 108 may include a metal boride, e.g., tantalum boride, titanium boride, or the like, a metal boronitride, e.g., tantalum boronitride, and/or a titanium boronitride, and/or a metal compound, e.g., tantalum carbon borofluoride (CFBTa). The adhesion layer 110 may include a metal, e.g., tantalum, titanium, or the like. The seed layer 112 may include a metal, e.g., ruthenium (Ru), rhenium (Re), or the like.

The MTJ layer 114 may include a pinned layer 114a, a tunnel barrier layer 114b and/or a free layer 114c.

The pinned layer 114a may include a ferromagnetic material, e.g., cobalt, platinum, iron, and/or nickel. In some example embodiments, the pinned layer 114a may include cobalt platinum alloy (CoPt), or may have a multi-layer structure including cobalt layers and platinum layers alternately stacked.

The tunnel barrier layer 114b may include, e.g., magnesium oxide and/or aluminum oxide.

The free layer 114c may include a ferromagnetic material, e.g., cobalt, platinum, iron, and/or nickel.

In some example embodiments, at least one of the pinned layer 114a, the tunnel barrier layer 114b, and the free layer 114c may be formed as a plurality of layers.

In some example embodiments, the MTJ layer 114 may include the free layer 114c, the tunnel barrier layer 114b and/or the pinned layer 114a sequentially stacked.

The upper electrode layer 120 may serve as a hard mask layer for etching the lower MTJ layer 114 and/or the lower electrode layer 106.

The upper electrode layer 120 may include a metal and/or a metal nitride. The upper electrode layer 120 may include at least one of metals, e.g., tungsten, titanium, tantalum, and/or iron, and/or metal nitrides, e.g., tungsten nitride, titanium nitride, tantalum nitride, or the like. In some example embodiments, the upper electrode layer 120 may include tungsten.

Each, or one or more, of the lower electrode layer 106, the blocking layer 108, the adhesion layer 110, the seed layer 112, the MTJ layer 114 and/or the upper electrode layer 120 may be formed by a sputtering process, a physical vapor deposition (PVD) process, a CVD process and/or an atomic layer deposition (ALD) process.

Figure 3:
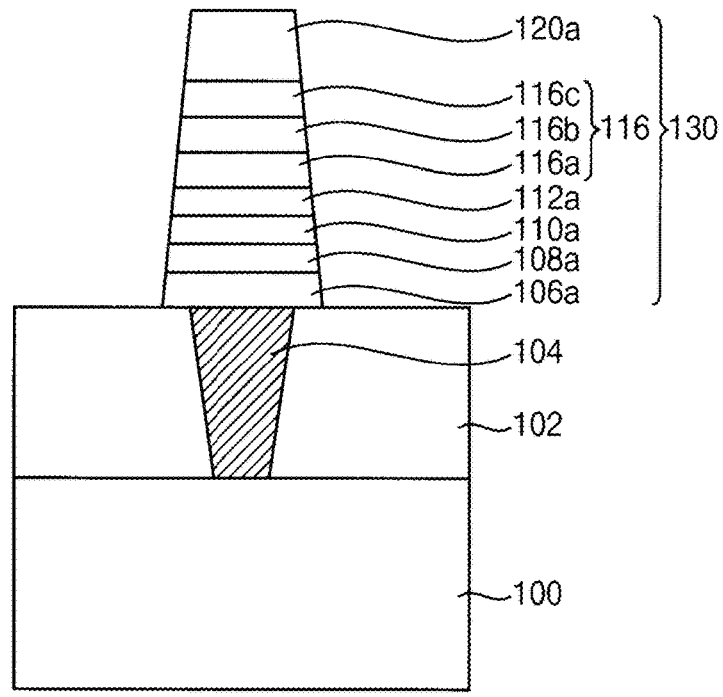

Referring to FIG. 3, an etch mask pattern (not shown) may be formed on the upper electrode layer 120, and the upper electrode layer 120 may be etched using the etch mask pattern to form an upper electrode 120a. The etch mask pattern may include a photoresist pattern and/or an insulation pattern.

The MTJ layer 114, the seed layer 112, the adhesion layer 110, the blocking layer 108 and/or the lower electrode layer 106 may be sequentially patterned by an etching process using the upper electrode 120a as an etching mask to form a memory structure 130. The memory structure 130 may be formed on the contact plug, and the memory structure 130 may include a lower electrode 106a, a blocking pattern 108a, an adhesive pattern 110a, a seed pattern 112a, an MTJ structure 116 and/or an upper electrode 120a sequentially stacked.

The MTJ structure 116 may include a pinned layer pattern 116a, a tunnel barrier pattern 116b and/or a free layer pattern 116c stacked.

The etching process may include a dry etching process such as an ion beam etching process, a sputter etching process and/or a radio-frequency etching process. In some example embodiments, when the ion beam etching process is performed, the upper electrode layer 120, the MTJ layer 114, the seed layer 112, the adhesion layer 110, the blocking layer 108 and/or the lower electrode layer 106 may be effectively etched.

A stacked structure of the memory structure 130 may not be limited to the above, and may be variously modified. As shown in FIG. 3, the memory structure 130 may have an inclined sidewall, and thus a cross sectional view of the memory structure 130 may have a trapezoidal shape. In some example embodiments, the sidewall of the memory structure 130 may have a vertical slope.

In some example embodiments, although not shown, the first insulating interlayer 102 exposed by the both sides of the memory structure 130 may be partially removed during the patterning process. In this case, a height of an upper surface of the first insulating interlayer 102 exposed by the both sides of the memory structure 130 may decrease.

Figure 4:
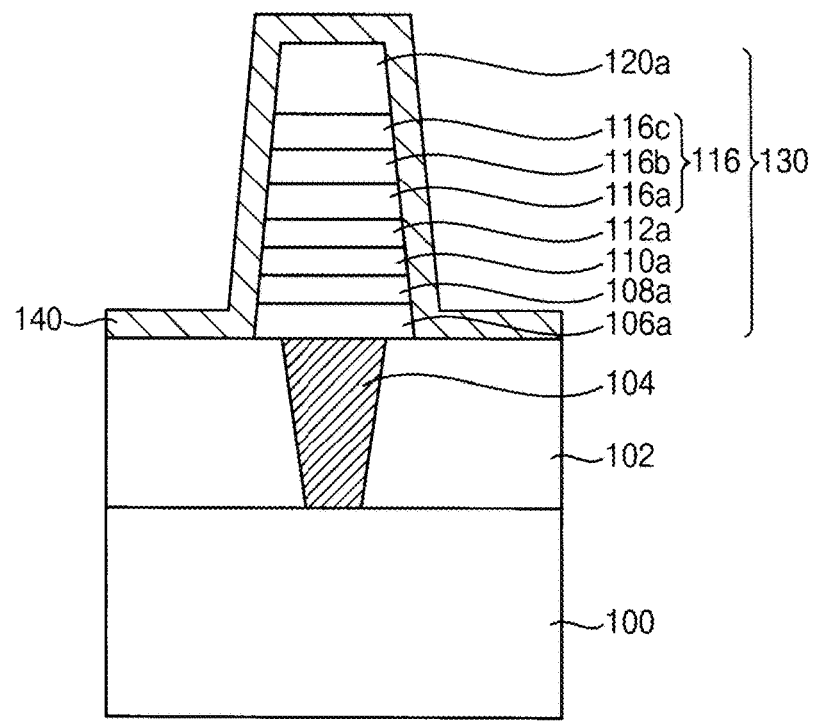

Referring to FIG. 4, a protection layer 140 may be formed on the first insulating interlayer 102 and/or a surface of the memory structure 130. The protection layer 140 may cover the surface of the memory structure 130.

The protection layer 140 may be formed by a CVD process using plasma. For example, the protection layer 140 may be formed by a PE-CVD process. The protection layer 140 may include, e.g., silicon nitride.

The protection layer 140 directly contacts the surface of the memory structure 130. Thus, plasma damages may be caused to the memory structure 130 during the process for forming the protection layer 140. Particularly, the tunnel barrier pattern 116b and/or the free layer pattern 116c of the MTJ structure 116 included in the memory structure 130 may be damaged, and in this case, magnetic properties of the memory structure 130 may be changed due to the plasma damages. Thus, the protection layer 140 may be formed under a condition so as to reduce the plasma damages of the surface of the memory structure 130.

Deposition gases for forming the protection layer 140 may include a silicon source gas, a nitrogen source gas containing no hydrogen and/or a dissociation gas.

In some example embodiments, the silicon source gas may include $SiH_4$, $Si_2H_6$, $Si_3H_8$, and/or $Si_2H_6$. In some example embodiments, the nitrogen source gas may include $N_2$. In some example embodiments, the dissociation gas may include an inert gas, e.g., helium, argon and/or neon. For example, the deposition gases may include $SiH_4$, $N_2$ and/or helium.

When the protection layer 140 is formed using the nitrogen source gas including hydrogen, characteristics of the MTJ structure 116 may be degraded by the hydrogen. Thus, the nitrogen source gas for forming the protection layer 140 may use a gas containing no hydrogen. Particularly, $NH_3$ may not be used as the nitrogen source. Thus deterioration of magnetic properties due to hydrogen bonded on sidewall of the MTJ structure may be decreased.

In some example embodiments, when the protection layer 140 is formed using the nitrogen source gas including $N_2$, process conditions may be controlled so that the $N_2$ may be decomposed to form a silicon nitride. For example, for dissociating the $N_2$, a large amount of the dissociation gas may be introduced in the deposition chamber.

In some example embodiments, when the silicon source gas and the nitrogen source gas are used as $SiH_4$ and $N_2$, respectively, in the process for forming the protection layer 140, a decomposition energy of the $N_2$ may be higher than a decomposition energy of the $SiH_4$. Thus, the $SiH_4$ may be easily decomposed, but the $N_2$ may not be easily decomposed. That is, an amount of decomposition of the $N_2$ may be less than an amount of decomposition of the $SiH_4$, in the deposition chamber for depositing the protection layer 140, and thus the silicon nitride may not be normally formed. Therefore, a large amount of the dissociation gas may be introduced to the deposition chamber for promoting of the decomposition of the $N_2$, so that the $N_2$ may be sufficiently decomposed to form the silicon nitride.

In some example embodiments, the dissociation gas may have a flow rate of about 50% to about 90% of total deposition gases. As used herein, the term "about" means plus or minus 10% of a value. When the flow rate of the dissociation gas is less than 50% of the flow rate of the total deposition gases, the $N_2$ may not be sufficiently decomposed. When the flow rate of the dissociation gas is greater than 90% of the flow rate of the total deposition gases, the flow rates of the silicon source gas and the nitrogen source gas may be relatively decreased. Thus, a deposition of a silicon layer may not be easy.

In some example embodiments, the flow rate of the $N_2$ gas may be much greater than the flow rate of the $SiH_4$ gas, in the process for forming the protection layer 140. Since the $N_2$ gas has a high decomposition energy, the $N_2$ gas may be sufficiently introduced into the deposition chamber to normally form the SiN layer. The flow rate of the $N_2$ gas may be at least three times of the flow rate of the $SiH_4$ gas. For example, the flow rate of the $N_2$ gas may be in a range of about 3 times to about 100 times of the flow rate of the $SiH_4$ gas.

In some example embodiments, the flow rate of the $SiH_4$ gas may be less than about 10% of the total deposition gases. For example, the flow rate of the $SiH_4$ gas may be in a range of about 0.1% to about 10% of the total deposition gases. Also, the flow rate of the $N_2$ gas may be less than 50% of the total deposition gases. For example, the flow rate of the $N_2$ gas may be in a range of about 8% to about 49% of the total deposition gases.

In some example embodiments, the protection layer 140 may be formed under a pressure in a range of about 1 Torr to about 10 Torr. Preferably, the protection layer 140 may be formed at a low pressure in a range of about 1 Torr to about 3 Torr. By performing the deposition process at the low pressure, the hydrogen included in the protection layer 140 may be reduced.

In some example embodiments, the protection layer 140 may be formed at a temperature of about 350° C. or less. Particularly, the protection layer 140 may be formed at the temperature of about 10° C. to about 350° C. When the protection layer 140 is formed at the temperature higher than 350° C., the magnetic properties of layers included in the memory structure 130 may be changed due to the heat. Further, the protection layer 140 may not be easily deposited at the temperature lower than 10° C.

In some example embodiments, the protection layer 140 may be formed by a PE-CVD process using plasma of only a high frequency R.F. power. For example, the high frequency R.F. power may be in 13.56 Hz band. When the protection layer 140 is formed using the plasma of only the high frequency R.F. power, damages of the MTJ structure 116 due to the plasma may be reduced.

In some example embodiments, when the protection layer 140 is formed, the high frequency R.F. power may be periodically and repeatedly applied in a pulsed manner. When the high frequency R.F. power is applied in the pulsed manner, the damages of the MTJ structure 116 due to the plasma may be reduced.

In some example embodiments, the plasma of the pulsed manner may have a duty cycle of about 15% or less. Here, the duty cycle may be a ratio of a pulse width W and a pulse period T. For example, the plasma of the pulsed manner may have the duty cycle of about 1% to about 10%. When the duty cycle is higher than about 10%, the plasma damages may occur. When the duty cycle is lower than about 1%, the deposition process may not easily be performed.

As shown in FIG. 7, for example, when the pulse period T is 2.0 ms, the pulse width W (e.g., a time of applying the R.F. power) may be 0.2 ms. Thus, the duty cycle may be about 10%.

A content of hydrogen in the protection layer 140 formed using a nitrogen source gas containing no hydrogen may be smaller than a content of hydrogen in a protection layer formed using a nitrogen source gas containing hydrogen. In some example embodiments, the protection layer 140 may include the hydrogen content of about 14% or less. For example, the protection layer 140 may include the hydrogen content of about 5% to about 14%.

The protection layer 140 may be a silicon rich SiN layer having an amount of silicon higher than that of nitrogen. In some example embodiments, a rate of the nitrogen and the silicon included in the protection layer 140 may be 1:1.2 to 1:1.5.

In some example embodiments, the etching process illustrated with reference to FIG. 3 and the deposition process of the protection layer illustrated with reference to FIG. 4 may be performed in a vacuum. That is, the etching process and the deposition process may be performed in the etching chamber and the deposition chamber included in the same equipment, respectively, without a vacuum break.

FIG. 6 illustrates the equipment for performing the etching process and the deposition process.

Referring to FIG. 6, an etching chamber 20 for performing the etching process and a deposition chamber 22 for performing the deposition process may be connected to a transfer chamber 16. Transfer members 18 for transferring the substrate may be included in the transfer chamber 16.

The substrate may be transferred between the etching chamber 20 and the deposition chamber 22 via the transfer chamber 16 maintained in the vacuum. The transfer chamber 16 may be connected to a load lock chamber 14. The load lock chamber 14 may be connected to a transfer port 12 and/or a load port 10 for mounting a cassette or a Front Opening Unified Pod (FOUP) to receive the substrate.

Hereinafter, a method for forming the protection layer including the silicon nitride may be briefly described with reference to FIG. 6.

First, the etching process illustrated with reference to FIG. 3 may be performed in the etching chamber 20. The substrate on which the etching process is performed may be transferred from the etching chamber 20 to the transfer chamber 16. Thereafter, the substrate in the transfer chamber 16 may be transferred to the deposition chamber 22, and the substrate may be loaded onto a chuck in the deposition chamber 22.

Therefore, the etching process and the deposition process may be performed while the vacuum is maintained, so that sidewalls of the memory structure 130 may not be oxidized during the transferring the substrate. Thus, defects due to oxidation of the sidewalls of the MTJ structure may be reduced.

The protection layer 140 may be formed by a chemical vapor deposition process using plasma of the high frequency R.F. power. Also, in the chemical vapor deposition process, a silicon source gas, a nitrogen source gas and a dissociation gas may be introduced in the deposition chamber 22. The high frequency R.F. power may be applied in the pulsed manner.

As described above, the protection layer 140 may be formed on the surface of the memory structure 130 and/or the first insulating interlayer 102. The protection layer 140 may have a dense structure. Also, the plasma damages of the memory structure 130 may be reduced during forming the protection layer 140. Particularly, deterioration of the tunnel barrier pattern 116b and the free layer pattern 116c in the MTJ structure 116 may be reduced. Thus, the magnetoresistive memory device including the memory structure may have excellent or improved tunnel magnetoresistance (TMR) and retention characteristics.

Figure 5:
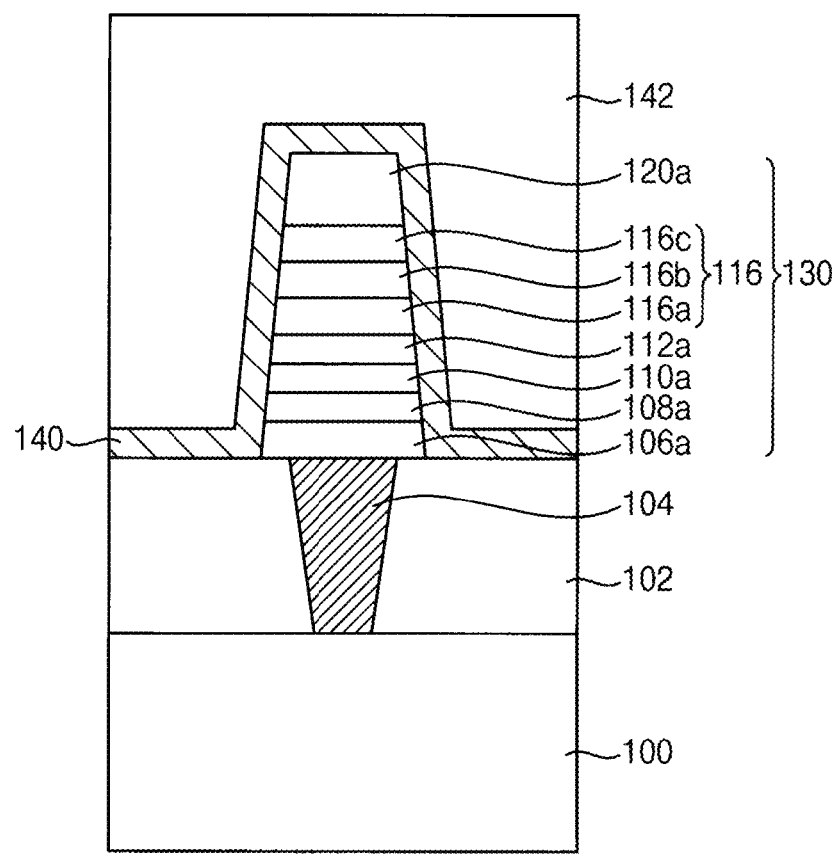

Referring to FIG. 5, a second insulating interlayer 142 may be formed on the protection layer 140. The second insulating interlayer 142 may include silicon oxide.

In some example embodiments, an upper surface of the second insulating interlayer 142 may be higher than an upper surface of the memory structure 130. In some example embodiments, a planarization process of the surface of the second insulating interlayer 142 may be further performed to have a flat upper surface thereof.

The process for forming the protection layer on the surface of the memory structure in the magnetoresistive memory device may be described above. However, the process for forming the protection layer may be equally used for forming a capping layer or an encapsulation layer of the surfaces of patterns in various semiconductor devices. For example, the protection layer may be formed on a surface of a GST ($Ge_2Sb_2Te_5$) pattern, which is a phase change pattern in a phase change memory device (PRAM) by the process described above.

FIGS. 8 to 12 are cross-sectional views illustrating a method of manufacturing a magnetoresistive memory device.

The method of manufacturing the magnetoresistive memory device may include processes substantially the same as or similar to those illustrated with reference to FIGS. 3 to 7, and thus detailed descriptions thereof may be omitted.

Figure 8:
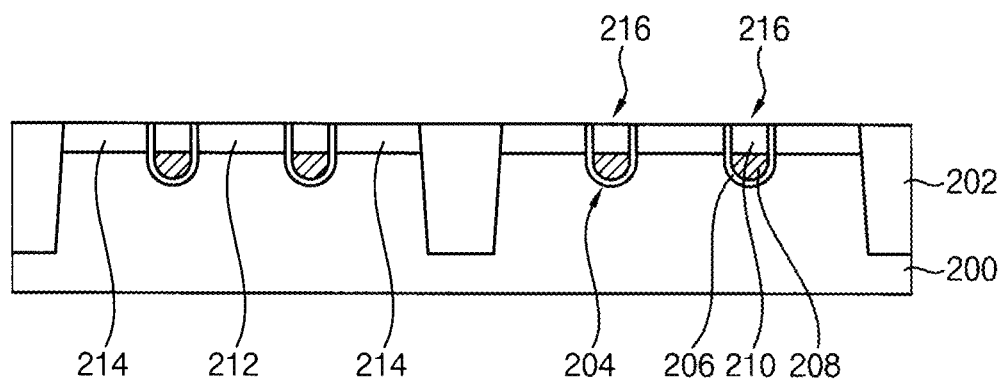

Referring to FIG. 8, an isolation layer 202 may be formed at a substrate 200 to divide the substrate 200 into an active region and a field region. The isolation layer 202 may be formed by a shallow trench isolation (STI) process. A plurality of active regions may be regularly arranged, and each, or one or more, of the active regions may have an isolated island shape.

Cell transistors 216 may be formed on the substrate 200. In some example embodiments, two cell transistors 216 may be formed in an isolated active region.

In some example embodiments, the cell transistors 216 may be buried gate type transistors. For forming the cell transistors 216, first, a mask pattern may be formed on the substrate 200, and the substrate may be etched using the mask pattern to form a trench 204 extending in the first direction. Two trenches 204 may be formed in each, or one or more, of the active regions. A gate including a gate insulation layer pattern 206, a gate electrode 208 and a hard mask pattern 210 may be formed in the trenches 204. Also, impurities may be implanted into the active region adjacent both sides of the gate to form a first impurity region 212 and a second impurity region 214. In some example embodiments, the first impurity region 212 may serve as a common source region of the two cell transistors 216.

In some example embodiments, the cell transistors 216 may be described as buried gate transistors, but may not be limited thereto. Alternately, the cell transistors may be planar type transistors or fin type transistors.

Figure 9:
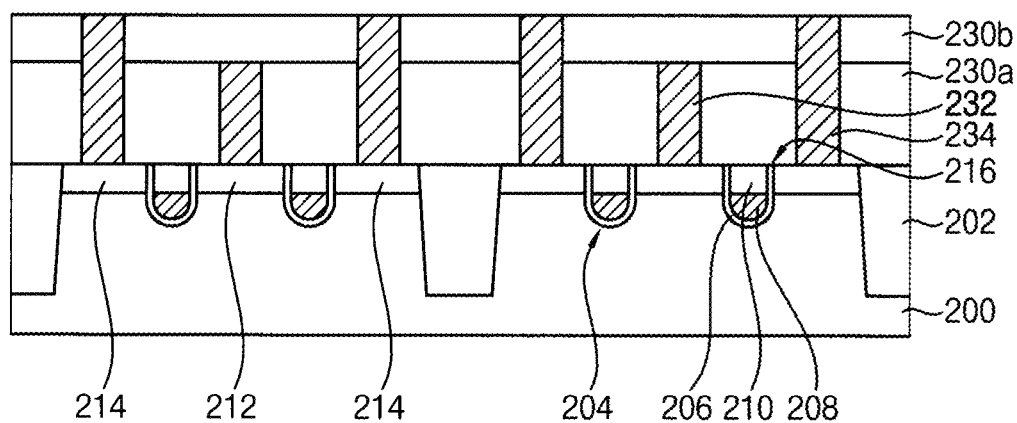

Referring to FIG. 9, a first lower insulating interlayer 230a covering the cell transistors 216 may be formed on the substrate 200. Thereafter, an upper surface of the first lower insulating interlayer 230a may be planarized by planarization process. The planarization process may include a CMP (chemical mechanical polishing process) or etch back process.

A portion of the first lower insulating interlayer 230a may be etched to form a first opening exposing a surface of the first impurity region 212. The first opening may extend in the first direction. A first conductive layer may be formed to fill the first opening, and the first conductive layer may be planarized to form a source line 232. A plurality of source lines 232 may contact a plurality of first impurity regions 212, respectively. The source line 232 may include a metal, e.g., tungsten, titanium, and/or tantalum, and/or a metal nitride, e.g., tungsten nitride, titanium nitride, tantalum nitride, or the like.

A second lower insulating interlayer 230b may be formed on the first lower insulating interlayer 230a and the source lines 232. An upper surface of the first lower insulating interlayer 230a may be flat, and thus the second lower insulating interlayer 230b may have a flat upper surface. The first and second lower insulating interlayers 230a and 230b may include silicon oxide.

Second openings may be formed through the first and second lower insulating interlayers 230a and 230b to expose the second impurity regions 214, respectively. A second conductive layer may be formed to fill the second openings, and the second conductive layer may be planarized to form lower contact plugs 234. The lower contact plugs 234 may contact the second impurity regions 214, respectively. The lower contact plugs 234 may include a metal, e.g., tungsten, titanium, and/or tantalum, and/or a metal nitride, e.g., tungsten nitride, titanium nitride, tantalum nitride, or the like.

Thus, the source lines 232 may be formed in the first lower insulating interlayer 230a, and the lower contact plugs 234 may be formed in the first and second lower insulating interlayers 230a and 230b. Upper surfaces of the lower contact plugs 234 may be higher than upper surfaces of the source lines 232.

Figure 10:
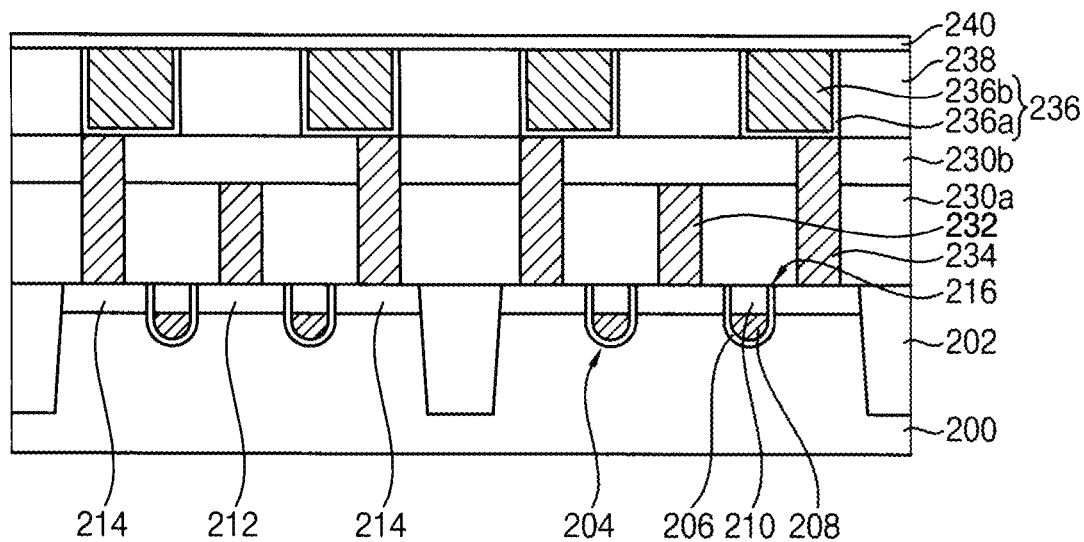

Referring to FIG. 10, pad patterns 236 may be formed on the second lower insulating interlayer 230b and/or the lower contact plugs 234. The pad patterns 236 may contact the lower contact plugs 234, respectively. Also, an insulation pattern 238 may be formed on the second lower insulating interlayer 230b between the pad patterns 236.

In some example embodiments, the pad patterns 236 may be formed by a damascene process. That is, an insulation layer may be formed on the second lower insulating interlayer 230b and the lower contact plugs 234. The insulation layer may be formed of silicon nitride and/or silicon oxide. A portion of the insulation layer may be etched to form an opening exposing an upper surface of the lower contact plug 234. Thereafter, a pad layer may be formed on the insulation layer to fill the opening. The pad layer may be planarized until an upper surface of the insulation layer may be exposed to form the pad patterns 236. Also, an insulation pattern 238 may be formed on the second lower insulating interlayer 230b between the pad patterns 236.

In some example embodiments, the pad layer may include a barrier layer and/or a metal layer. The barrier layer may include, e.g., titanium, tantalum, tungsten nitride, titanium nitride, tantalum nitride, or the like, and the metal layer may include, e.g., tungsten, copper, aluminum, or the like. The barrier layer may be conformally formed on surfaces of the opening and the insulation layer. The metal layer may be formed to completely fill the opening. Thus, each, or one or more, of the pad patterns 236 may include a barrier pattern 236a and a metal pattern 236b.

In some example embodiments, the pad patterns 236 may be formed in an embossed process. That is, a pad layer may be formed on the second lower insulating interlayer 230b and the lower contact plugs 234. The pad layer may be patterned to form the pad patterns 236 contacting the lower contact plugs 234, respectively. Thereafter, an insulation layer may be formed on the second lower insulating interlayer 230b to fill a portion between the pad patterns 236, and the insulation layer may be planarized to form the insulation pattern 238.

An etch stop layer 240 may be formed on the pad patterns 236 and the insulation pattern 238. The etch stop layer 240 may be formed by a CVD process or an ALD process, and the etch stop layer 240 may include silicon nitride and/or silicon oxynitride.

In some example embodiments, the etch stop layer 240 may be formed by performing processes the same as the processes for forming the protection layer illustrated with reference to FIG. 4. However, the processes for forming the etch stop layer 240 may not be limited thereto.

Figure 11:
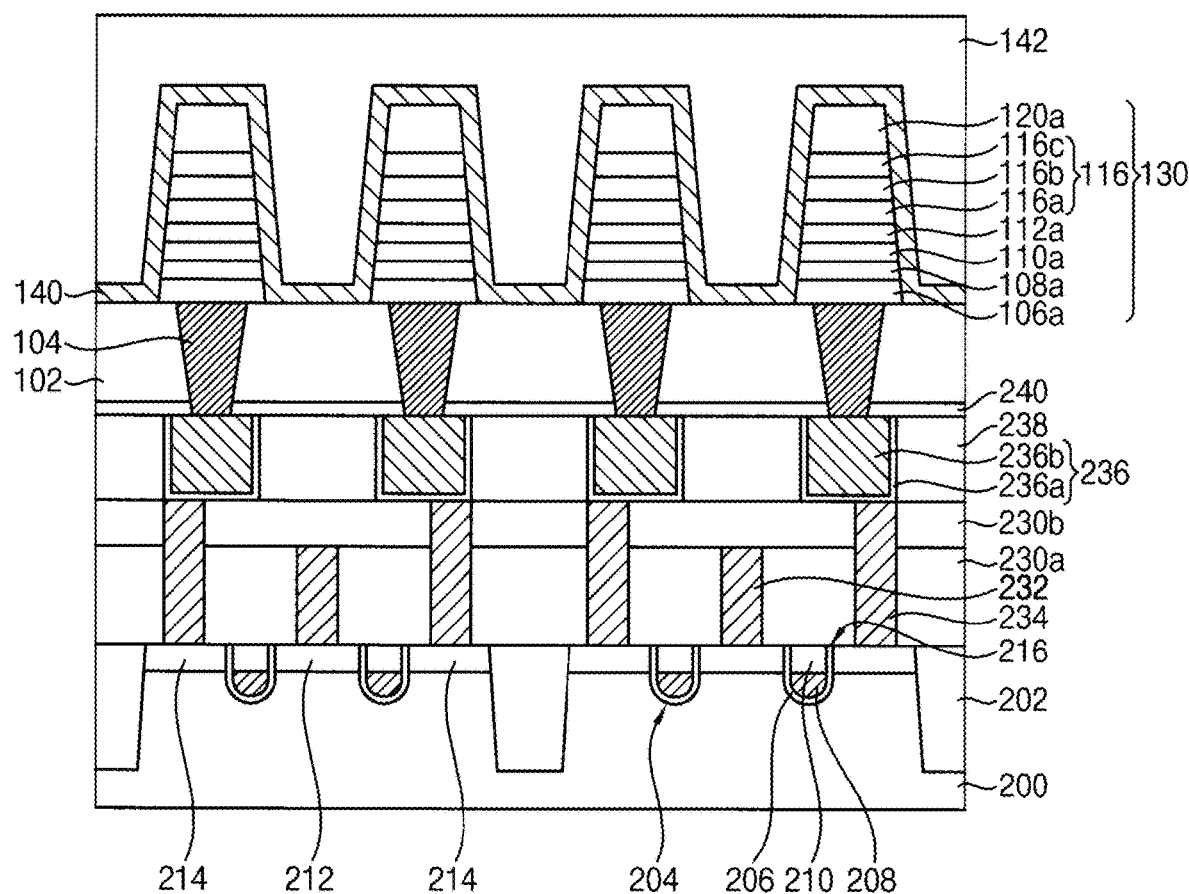

Referring to FIG. 11, processes the same as the processes illustrated with reference to FIGS. 1 to 7 may be performed on the etch stop layer 240. Therefore, a structure the same as the structure illustrated in FIG. 5 may be formed on the etch stop layer 240.

In brief, the first insulating interlayer 102 and the contact plug 104 may be formed on the etch stop layer 240. In this case, the contact plug 104 may be formed through the first insulating interlayer 102 and the etch stop layer 240, and the contact plug 104 may contact an upper surface of the pad pattern 236.

The memory structure 130 may be formed on the contact plug 104. Further, a protection layer 140 may be formed to cover the memory structure 130 and the first insulating interlayer 102. A second insulating interlayer 142 may be formed on the protection layer 140 to cover the memory structure 130.

As described above, the plasma damages may be reduced in the process for forming the protection layer 140. Thus, the MTJ structure 116 may be formed to have excellent or improved tunnel magnetoresistance (TMR) and data retention characteristics.

Figure 12:
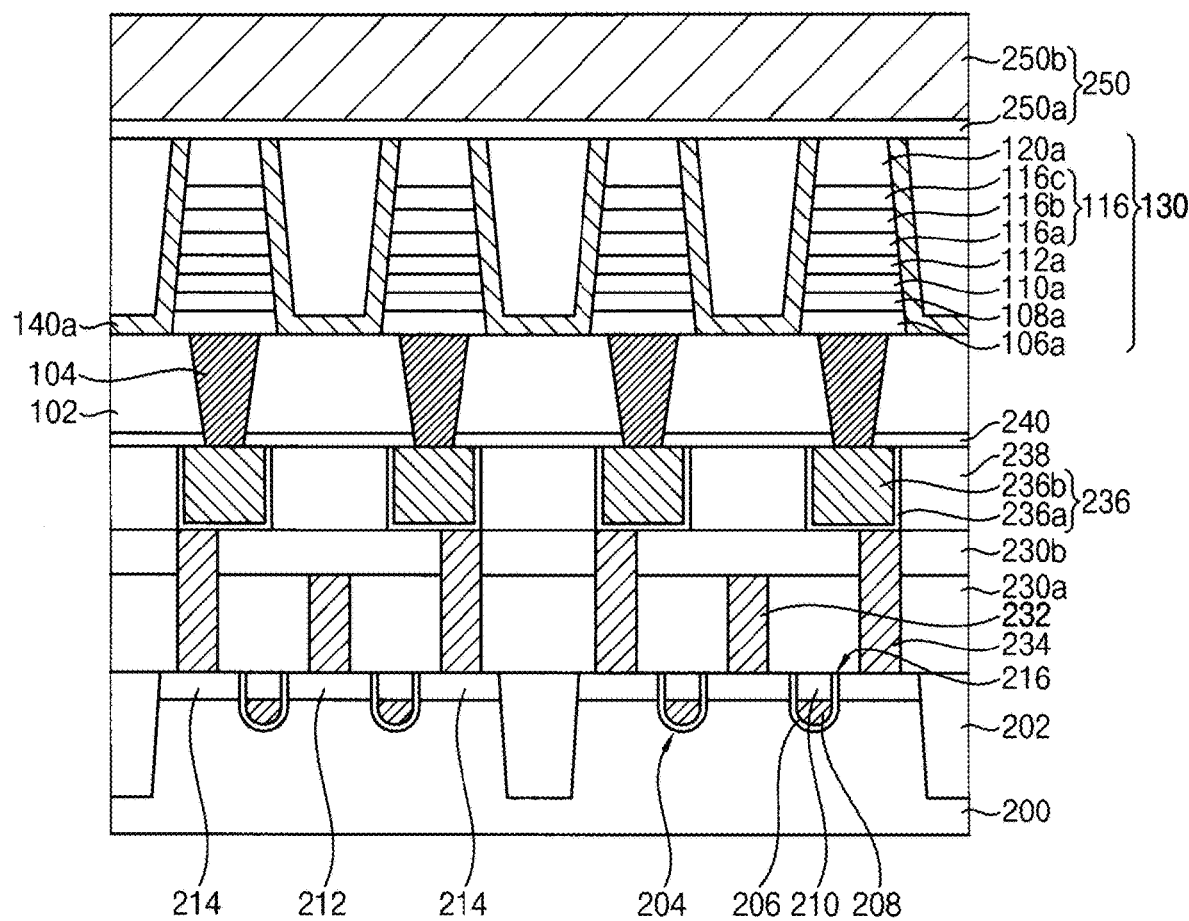

Referring to FIG. 12, portions of the second insulating interlayer 142 and the protection layer 140 may be etched to form a trench exposing an upper surface of the upper electrode 120a. A bit line 250 may be formed in the trench.

In the process for forming the trench, the protection layer 140 on the upper electrode 120a may be etched to form a protection pattern 140a. The trench may extend in a second direction perpendicular to the first direction.

In some example embodiments, a barrier metal layer may be formed on sidewalls and/or a bottom of the trench, and a metal layer may be formed on the barrier metal layer to fill the trench. The metal layer and/or the barrier metal layer may be planarized to form the bit line. The barrier metal layer may include, e.g., titanium, titanium nitride, tantalum, tantalum nitride, or the like. The metal layer may include e.g., copper, tungsten, aluminum, or the like. Therefore, the bit line 250 may include a barrier metal pattern 250a and a metal pattern 250b. The bit line 250 may contact the upper electrode 120a.

In some example embodiments, a via contact (not shown) may be further formed between the upper electrode 120a and the bit line 250.

Thereafter, although not shown, a third insulating interlayer may be further formed to cover the second insulating interlayer and the bit line 250.

The magnetoresistive memory device in accordance with some example embodiments may be used as a memory included in electronic products such as mobile devices, memory cards, computers, or the like.

The foregoing is illustrative of some example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a magnetoresistive random access memory, the method comprising:
 forming a memory structure on a substrate, the memory structure including a lower electrode, a magnetic tunnel junction (MTJ) structure, and an upper electrode sequentially stacked on the substrate; and
 forming a protection layer covering a surface of the memory structure, the protection layer including silicon nitride,
 wherein the forming the protection layer includes a chemical vapor deposition process, the chemical vapor deposition process including
  using a plasma, and
  introducing deposition gases including a silicon source gas, a nitrogen source gas containing no hydrogen, and a dissociation gas, the dissociation gas being introduced at a flow rate of 50% to 90% of the deposition gases.

2. The method of claim 1, wherein the using the plasma includes applying a high frequency R.F. power in 13.56 MHz band.

3. The method of claim 1, wherein the using the plasma includes applying an R.F. power in pulses.

4. The method of claim 3, wherein a duty cycle of the plasma is in a range of about 1% to about 10%.

5. The method of claim 1, wherein the nitrogen source gas includes $N_2$.

6. The method of claim 1, wherein the dissociation gas includes an inert gas.

7. The method of claim 1, wherein the silicon source gas includes $SiH_4$, $Si_2H_6$, $Si_3H_8$, or $Si_2H_6$.

8. The method of claim 1, wherein the forming the protection layer further comprises:
 introducing the nitrogen source gas at a flow rate higher than a flow rate of the silicon source gas.

9. The method of claim 8, wherein the flow rate of the nitrogen source gas is in a range of about 3 times to about 100 times of the flow rate of the silicon source gas.

10. The method of claim 1, wherein the forming the protection layer further comprises:
 introducing the silicon source gas at a flow rate of about 0.1% to about 10% of the deposition gases, and
 introducing the nitrogen source gas at a flow rate of about 8% to about 49% of the deposition gases.

11. The method of claim 1, wherein the forming the memory structure comprises:
 forming a lower electrode layer, an MTJ layer, and an upper electrode layer sequentially stacked on the substrate; and
 etching portions of the upper electrode layer, the MTJ layer and the lower electrode layer to form the memory structure including the lower electrode, the MTJ structure and the upper electrode.

12. A method of manufacturing a magnetoresistive random access memory, the method comprising:
 forming a transistor on a substrate, the transistor including a gate, a first impurity region and a second impurity region;
 forming a source line electrically connected to the first impurity region;
 forming a memory structure including a lower electrode, a magnetic tunnel junction (MTJ) structure and an upper electrode sequentially stacked, the memory structure being electrically connected to the second impurity region;
 forming a protection layer covering a surface of the memory structure, the protection layer including silicon nitride; and
 forming a bit line on the memory structure, the bit line being electrically connected to the upper electrode of the memory structure,
 wherein the forming the protection layer includes a chemical vapor deposition process including
  using a plasma, and
  introducing deposition gases including a silicon source gas, a nitrogen source gas containing no hydrogen, and a dissociation gas the dissociation gas being introduced at a flow rate of 50% to 90% of the deposition gases.

13. The method of claim 12, wherein the using the plasma includes applying a high frequency R.F. power in 13.56 MHz band.

14. The method of claim 12, wherein the using the plasma includes applying an R.F. power in pulses.

15. The method of claim 12, wherein the nitrogen source gas includes $N_2$.

16. A method of manufacturing a magnetoresistive random access memory, the method comprising:
 sequentially forming a lower electrode layer, a magnetic tunnel junction (MTJ) layer, and an upper electrode layer on a substrate;
 etching portions of the upper electrode layer, the MTJ layer, and the lower electrode layer to form a memory structure, the memory structure including a lower electrode, an MTJ structure, and an upper electrode on the substrate;
 loading the substrate into a deposition chamber; and
 forming a protection layer covering a surface of the memory structure, the protection layer including silicon nitride,
 wherein the forming the protection layer includes
  introducing deposition gases into the deposition chamber, the deposition gases including a silicon source gas, a nitrogen source gas containing no hydrogen, and a dissociation gas, the dissociation gas being introduced at a flow rate of 50% to 90% of the deposition gases introduced into the deposition chamber, and
  periodically applying an R.F. power in a pulse to generate plasma.

17. The method of claim 16, wherein the R.F. power has a high frequency in a 13.56 MHz band.

18. The method of claim 16, wherein the nitrogen source gas includes $N_2$.

* * * * *